(12) United States Patent
Maemori et al.

(10) Patent No.: US 8,349,549 B2
(45) Date of Patent: Jan. 8, 2013

(54) RESIST SURFACE MODIFYING LIQUID, AND METHOD FOR FORMATION OF RESIST PATTERN USING THE SAME

(75) Inventors: Satoshi Maemori, Kanagawa (JP); Tomoya Kumagai, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 392 days.

(21) Appl. No.: 12/591,585

(22) Filed: Nov. 24, 2009

(65) Prior Publication Data

US 2010/0129758 A1 May 27, 2010

(30) Foreign Application Priority Data

Nov. 26, 2008 (JP) ................................. 2008-300639

(51) Int. Cl.
*G03F 7/00* (2006.01)
*G03F 7/40* (2006.01)

(52) U.S. Cl. ...................... 430/331; 430/270.1; 430/330

(58) Field of Classification Search ............... 430/270.1, 430/312, 330, 271.1, 273.1, 331
See application file for complete search history.

(56) References Cited

U.S. PATENT DOCUMENTS

| | | | | |
|---|---|---|---|---|
| 6,605,417 B2 * | 8/2003 | Nitta et al. | ..................... | 430/326 |
| 7,195,863 B2 * | 3/2007 | Takano et al. | .................. | 430/327 |
| 7,666,572 B2 * | 2/2010 | Harada et al. | .............. | 430/270.1 |
| 7,670,750 B2 * | 3/2010 | Harada et al. | .............. | 430/270.1 |
| 7,799,513 B2 * | 9/2010 | Akiyama et al. | ............... | 430/322 |
| 7,807,341 B2 * | 10/2010 | Kido | .............................. | 430/330 |
| 8,026,047 B2 * | 9/2011 | Namatsu et al. | ............... | 430/322 |
| 2003/0138736 A1 * | 7/2003 | Nitta et al. | ..................... | 430/326 |
| 2009/0053657 A1 * | 2/2009 | Hatakeyama et al. | ......... | 430/324 |
| 2010/0183978 A1 * | 7/2010 | Yoshidome | ................ | 430/270.1 |
| 2011/0262859 A1 * | 10/2011 | Kusabiraki et al. | ......... | 430/270.1 |

FOREIGN PATENT DOCUMENTS

| | | |
|---|---|---|
| JP | 6-186754 | 7/1994 |
| JP | 2007-88256 | 4/2007 |
| JP | 2007-173274 | 7/2007 |
| JP | 2008-42019 | 2/2008 |
| JP | 2010-44233 | 2/2010 |

OTHER PUBLICATIONS

D. Gil et al., "First Microprocessors with Immersion Lithography", Proceedings of SPIE, vol. 5754, pp. 119-128, 2005.
S. Kodoma et al., "Synthesis of Novel Fluoropolymer for 157nm Photoresists by Cyclo-Polymerization", Proceedings of SPIE, vol. 4690, pp. 76-83, 2002.
M. Irie et al., "Surface Property Control for 193nm Immersion Resist", Journal of Photopolymer Science and Technology, vol. 19, No. 4, pp. 565-568, 2006.

* cited by examiner

*Primary Examiner* — Amanda C. Walke
(74) *Attorney, Agent, or Firm* — Wenderoth, Lind & Ponack, L.L.P.

(57) ABSTRACT

Provided are: a resist surface modifying liquid which is used as a surface treatment liquid of a resist film prior to a post exposure baking (PEB) step, and which can inhibit occurrence of defects of the resist film by reducing water repellency; and a method for forming a resist pattern using the same. A resist surface modifying liquid which is used as a surface treatment liquid prior to a post exposure baking (PEB) step of a resist film, the resist surface modifying liquid containing an acidic compound, and at least one of an alcohol-based solvent represented by a certain general formula and an ether-based solvent represented by a certain general formula.

7 Claims, No Drawings

RESIST SURFACE MODIFYING LIQUID, AND METHOD FOR FORMATION OF RESIST PATTERN USING THE SAME

This application is based on and claims the benefit of priority from Japanese Patent Application No. 2008-300639, filed on 26 Nov. 2008, the content of which is incorporated herein by reference.

BACKGROUND OF THE INVENTION

1. Field of the Invention

The present invention relates to a resist surface modifying liquid for use as a surface treatment liquid before a post exposure baking (PEB) step of a resist film, and a method for forming a resist pattern using the same.

2. Related Art

In lithographic techniques, for example, steps of: forming a resist film constituted with a resist material on a substrate; conducting selective exposure by irradiating the resist film with radiation such as an electron beam or light through a mask having a formed certain pattern; and subjecting to a developing treatment, whereby a resist pattern having a certain shape is formed, are carried out.

As micro-fabrication of semiconductor elements proceeds, shortening of the wavelength of the light source and increase in the numerical apertures (higher NA) of the projection lens proceed. At present, exposure devices with NA of 0.84 have been developed using an ArF excimer laser having a wavelength of 193 nm as a light source. As light sources having shorter wavelengths is used, improvement of lithography characteristics such as sensitivity to the light sources for exposure, resolution property to allow patterns of minute size to be reproduced, and the like is demanded for the resist material. As a resist material that meets such requirements, a chemically amplified resist containing a base resin having a solubility in an alkaline developer that will be altered by the action of an acid, and an acid generator that generates acid upon exposure has been used.

As one of the procedures for further improving the resolution property, a lithographic method, liquid immersion lithography generally referred to (hereinafter, may be also referred to as "liquid immersion exposure method"), has been known in which exposure (immersion exposure) is carried out while allowing a liquid (liquid for liquid immersion exposure) having a refractive index greater than that of the air to exist between the sample and an objective lens of the exposure device (see, e.g., Nonpatent Document 1).

Regarding the liquid immersion exposure method, it is reported that a high resolution similar to those exhibited in the case in which a light source with a shorter wavelength and in the case in which a high NA lens is used can be achieved even though a light source with the same exposure wavelength is used, and also reported that a decrease in the focal depth width is not found. Additionally, the liquid immersion exposure method can be carried out using a preexisting exposure device. Therefore, the liquid immersion exposure method is expected to be capable of realizing formation of a resist pattern with a high resolution and also with favorable focal depth width at low costs. Thus, in production of semiconductor elements in which a large capital investment is required, the liquid immersion exposure method has drawn attention as a method that greatly influences on semiconductor industry in terms of costs, as well as lithography characteristics such as resolution, etc.

Meanwhile, attention has been focused on characteristics such as water repellency and transparency of fluorine-containing compounds in recent years, and research and development in various fields have been extensively conducted. For example, in the field of resist materials, an acid labile group such as a methoxymethyl group, a tert-butyl group, or a tert-butyloxycarbonyl group is introduced into a fluorine-containing polymer compound at present, for use as a base resin of positive chemically amplified resist compositions. However, when such a fluorine-based polymer compound is used as a base resin of a positive resist composition, disadvantages such as generation of a large quantity of out-gas after the exposure, and insufficient resistance against dry etching gas (etching resistance), and the like may occur.

Recently, a fluorine-containing polymer compound having an acid labile group having a cyclic hydrocarbon group has been reported as a fluorine-containing polymer compound that is superior in etching resistance (for example, see Nonpatent Document 2). In addition, a fluorine-containing polymer compound for imparting water repellency to a resist film in a resist composition for liquid immersion exposure has been reported (for example, see Nonpatent Document 3).

Nonpatent Document 1: Proceedings of SPIE, Vol. 5754, pp. 119-128 (2005)

Nonpatent Document 2: Proceedings of SPIE, Vol. 4690, pp. 76-83 (2002)

Nonpatent Document 3: Journal of Photopolymer. Sci. Technol., Vol. 19, No. 4, pp. 565-568 (2006)

SUMMARY OF THE INVENTION

When a lithography process is carried out using a resist film having high water repellency such as a resist film in which the fluorine-containing polymer compound as described above is used, there is a problem in that defects are more likely to occur on the resist pattern after the development. Such defects tend to occur when the resist pattern after the development has higher water repellency. Therefore, even in the case in which a resin film is formed with a resin composition that includes a fluorine-containing polymer compound, it is necessary to reduce water repellency of the resist film after the development so as not to permit occurrence of defects.

The present invention was made in view of the above-mentioned problems, and an object of the present invention is to provide a resist surface modifying liquid which is used as a surface treatment liquid of a resist film prior to a post exposure baking (PEB) step, and which can inhibit occurrence of defects of the resist film by reducing water repellency, and a method for forming a resist pattern using the same.

The present inventors have conducted extensive studies in view of the foregoing problems. As a result, it was found that use of a resist surface modifying liquid including an acidic compound, and at least one of a certain alcohol-based solvent and a certain ether-based solvent enables water repellency of a resist pattern after the development to be reduced. Accordingly, the present invention was accomplished.

Specifically, the present invention provides the following.

A first aspect of the present invention provides a resist surface modifying liquid which is used as a surface treatment liquid of a resist film prior to a post exposure baking (PEB) step, the resist surface modifying liquid containing an acidic compound, and at least one of an alcohol-based solvent represented by the following general formula (1) and an ether-based solvent represented by the following general formula (2):

  (1)

  (2)

in the above general formulae (1) and (2), $R^1$, $R^2$, and $R^3$ each represent a linear or branched alkyl group, and $R^2$ and $R^3$ may bind to one another to form a ring structure.

A second aspect of the present invention provides a method for forming a resist pattern including the steps of: selectively exposing a resist film formed on a substrate; bringing the resist surface modifying liquid of the present invention into contact with the resist film after the exposure; and developing the resist film after the contact with the resist surface modifying liquid.

According to the present invention, since a resist surface modifying liquid contains an acidic compound, and at least one of a certain alcohol-based solvent and a certain ether-based solvent, water repellency of the resist pattern after the development can be reduced by using the resist surface modifying liquid as a surface treatment liquid of a resist film prior to a post exposure baking step. Thus, occurrence of defects in forming a resist pattern can be inhibited.

DETAILED DESCRIPTION OF THE INVENTION

Hereinafter, preferred modes for carrying out the present invention will be explained.

Resist Surface Modifying Liquid

The resist surface modifying liquid of the present invention is used as a surface treatment liquid of a resist film prior to a post exposure baking (PEB) step, and contains an acidic compound, and at least one of an alcohol-based solvent and an ether-based solvent respectively represented by a certain general formula.

Acidic Compound

The resist surface modifying liquid of the present invention includes an acidic compound. The acidic compound is not particularly limited, and may be any of an inorganic acid and an organic acid.

The inorganic acid which can be used in the resist surface modifying liquid may include conventionally well-known inorganic acids such as hydrochloric acid, nitric acid, sulfuric acid and phosphoric acid. Moreover, the organic acid may be any one of aliphatic organic acids and aromatic organic acids.

Examples of the aliphatic organic acid include formic acid, acetic acid, propionic acid, butyric acid, isobutyric acid, pentanoic acid, isovaleric acid, hexanoic acid, heptanoic acid, octanoic acid, nonanoic acid, decanoic acid, oxalic acid, maleic acid, malic acid, citric acid, methanesulfonic acid, and the like. Furthermore, examples of the aromatic organic acid include salicylic acid, gallic acid, benzoic acid, phthalic acid, and the like.

In addition, as the acidic compound, organic acids in which a portion or all hydrogen atoms in their hydrocarbon group are each substituted with a fluorine atom may be also exemplified.

Examples of such organic acids in which a portion or all hydrogen atoms in their hydrocarbon group are each substituted with a fluorine atom include organic acids represented by the following general formulae (3) to (6):

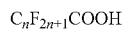

$C_nF_{2n+1}COOH$ (3)

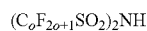

$(C_oF_{2o+1}SO_2)_2NH$ (4)

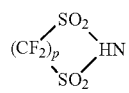

(5)

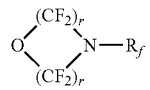

(6)

in the above general formulae (3) to (6), n represents an integer of 10 to 15; o represents an integer of 1 to 5; p represents 2 or 3; r represents 2 or 3; and Rf represents a hydrogen atom, or an alkyl group having 1 to 16 carbon atoms in which a portion or all hydrogen atoms are each substituted with a fluorine atom, and the alkyl group may have a hydroxyl group, an alkoxyalkyl group, a carboxyl group, or an amino group.

Specifically, as the acidic compound represented by the general formula (3), the compound represented the following formula (3a) is preferred.

$C_{10}F_{21}COOH$ (3a)

Specifically, as the acidic compound represented by the general formula (4), the compound represented by the following formula (4a) to (4c) is preferred.

$(C_4F_9SO_2)_2NH$ (4a)

$(C_3F_7SO_2)_2NH$ (4b)

$(CF_3SO_2)_2NH$ (4c)

Specifically, as the acidic compound represented by the general formula (5), the compound represented by the following formula (5a) is preferred.

(5a)

As the acidic compound represented by the general formula (6), the compound in which Rf is an alkyl group having a carboxyl group is preferred, and specifically, the compound represented by the following formula (6a) is preferred.

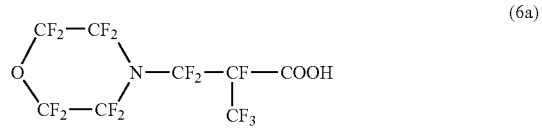

(6a)

The content of the acidic compound is preferably no lower than 0.001% by mass and no higher than 10% by mass, and more preferably no lower than 0.001% by mass and no higher than 1% by mass. When the content of the acidic compound falls within the above range, water repellency can be reduced while inhibiting film reduction of the resist film, whereby occurrence of defects can be effectively inhibited.

Solvent

The resist surface modifying liquid of the present invention contains as a solvent, at least one of an alcohol-based solvent represented by the following general formula (1) and an ether-based solvent represented by the following general formula (2):

$R^1—OH$ (1)

$R^2—O—R^3$ (2)

in the above general formulae (1) and (2), $R^1$, $R^2$, and $R^3$ each represent a linear or branched alkyl group, and $R^2$ and $R^3$ may bind to one another to form a ring structure.

When at least one of the alcohol-based solvent represented by the above general formula (1) and the ether-based solvent represented by the above general formula (2) is used as the solvent, water repellency can be reduced without dissolving the resist film.

Alcohol-based Solvent

As the alcohol-based solvent, any one may be used as long as it is represented by the above general formula (1).

Herein, $R^1$ preferably has no less than 4 carbon atoms in the general formula (1). When the number of carbon atoms is no less than 4, the resist film is less likely to be dissolved. In view of handleability as a solvent, the number of carbon atoms is preferably no more than 20, and particularly preferably no more than 10.

Examples of the alcohol represented by the general formula (1) include primary alcohols such as 1-hexanol, 1-pentanol, 1-heptanol, 1-octanol, 2-methyl-1-butanol, 2-ethylbutanol, 3-methyl-3-pentanol, 3-methylhexanol, 3-ethylhexanol, isobutanol, n-butanol, 3-methylbutanol, isopentanol, and 4-methylpentanol; secondary alcohols such as 2-pentanol, 3-pentanol, 2-butanol, 3-hexanol, methylisobutyl carbinol (4-methyl-2-pentanol), 2-methyl-3-pentanol, 2-methyl-4-hexanol, 2-methyl-3-hexanol, and 2-methyl-4-heptanol; and tertiary alcohols such as 2-methyl-2-butanol, 2-methyl-2-propanol, and 2-methyl-2-pentanol.

These alkyl groups may have a substituent. Although the substituent is not particularly limited, for example, a halogen atom, a halogenated alkyl group, or the like may be included.

Among the alcohol-based solvents described above, at least one selected from the group consisting of methylisobutyl carbinol, isobutanol, n-butanol, 2-methyl-1-butanol, isopentanol, 2-ethylbutanol, and 3-methyl-3-pentanol can be particularly preferably used.

Ether-based Solvent

As the ether-based solvent, any one can be used as long as it is represented by the above general formula (2).

Herein, the number of carbon atoms in $R^2$ and $R^3$ is preferably no less than 4. When the number of carbon atoms is no less than 4, the resist film is less likely to be dissolved. In view of handleability as a solvent, the number of carbon atoms is preferably no more than 20, and particularly preferably no more than 15.

As the ether-based solvent represented by the general formula (2), for example, ethylmethyl ether, butylpropyl ether, butylpentyl ether, di-n-butyl ether, diisobutyl ether, di-s-butyl ether, dipropyl ether, di-n-pentyl ether, methoxy-2-methylbutane, ethoxy-2-methylbutane, methoxy-2-methylpentane, 2-methylbutoxy-2-methylpentane, 3-methylbutoxy-2-methylhexane, ethylisoamyl ether, propylisoamyl ether, butylisoamyl ether, diisoamyl ether, di-t-amyl ether, diisobutyl ether, di-n-hexyl ether, and diisohexyl ether and the like may be exemplified.

$R^2$ and $R^3$ may bind to one another to form a ring structure. Examples of the ether-based solvent in which $R^2$ and $R^3$ form a ring structure include 1,8-cineol, 1,4-cineol, and the like.

These alkyl groups may have a substituent. Although the substituent is not particularly limited, for example, a fluoro group may be exemplified. As the ether having a substituent, for example, hydrofluoroether, and the like may be exemplified.

Among these ether-based solvents, at least one selected from the group consisting of diisoamyl ether, di-n-butyl ether, diisobutyl ether, di-s-butyl ether, di-n-pentyl ether, di-t-amyl ether, and di-n-hexyl ether can be particularly preferably used.

Blend Ratio of Alcohol-Based Solvent and Ether-Based Solvent

The alcohol-based solvent and the ether-based solvent may be used either alone, or in a combination of both of them. When used in a combination of both of them, the blend ratio of the alcohol-based solvent and the ether-based solvent is in terms of the amount of the ether-based solvent based on 1 of the amount of the alcohol-based solvent is preferably no less than 0.001 and no greater than 999, and more preferably no less than 0.01 and no greater than 99. By using the alcohol-based solvent in combination with the ether-based solvent, the boiling point, surface tension and the like of the resist surface modifying liquid can be adjusted, whereby option of coating properties can be broadened.

In order to achieve the effects of the present invention, total content of the certain solvent as described above and the acidic compound in the resist surface modifying liquid is preferably no lower than 50% by mass, and more preferably no lower than 80% by mass. In this case, other component which can be blended in the resist surface modifying liquid may be exemplified by a solvent which can be appropriately mixed with the alcohol-based solvent and the ether-based solvent, and which hardly dissolves the resist film, as well as an alkaline component for use in controlling diffusion of the acid, an surface active agent for use in improving the coating properties, and the like.

Method for Forming Resist Pattern

The method for forming a resist pattern of the present invention includes the steps of: selectively exposing a resist film formed on a substrate; bringing the resist surface modifying liquid of the present invention into contact with the resist film after the exposure step; and developing the resist film after the contact with the resist surface modifying liquid.

Resist Composition

The resist composition which may be used in the method for forming a resist pattern of the present invention is not particularly limited, and conventionally well-known chemically amplified resist compositions can be used. More specifically, by allowing the resist surface modifying liquid of the present invention to act on the resist film formed from a chemically amplified resist composition, occurrence of defects in the resist pattern after the development can be effectively inhibited.

However, in light of the prominent effect of inhibiting occurrence of defects in the resist pattern, which is achieved by the resist surface modifying liquid of the present invention, it is preferred that the resist surface modifying liquid be applied to a resist film which is formed by applying a resist composition for liquid immersion exposure, and which can be used without laminating a resist protective film for liquid immersion exposure on the upper layer. More specifically, the resist film which can be thus used without laminating a resist protective film for liquid immersion exposure has water repellency to the extent that prohibition of elution of the constitutive components of a liquid for liquid immersion exposure that contains a fluorine-containing polymer compound and is used in the liquid immersion exposure process is enabled; however, according to the method for forming a resist pattern of the present invention, water repellency of the resist pattern after the development can be reduced sufficiently by bringing the resist surface modifying liquid into contact with the resist film after exposure of the resist film.

Specifically, as the resist composition for liquid immersion exposure, a composition containing: a fluorine-containing polymer compound (F) including a constituent unit (f1) having a base-dissociable group and a constituent unit (f2) represented by the following general formula (f2-1); a base material component (A) having a solubility in an alkaline developer that will be altered by the action of an acid; and an acid generator component (B) which will generate an acid upon exposure can be used.

In such a resist composition, when an acid is generated from an acid generator component upon exposure, solubility of the base material component in an alkaline developer is altered by the action of the acid. Thus, the solubility of the exposed part in an alkaline developer is altered during formation of a resist pattern, while the solubility of the unexposed part in the alkaline developer is not altered. Therefore, the resist pattern can be formed by carrying out alkali development of this resist composition.

Fluorine-containing Polymer Compound (F)
Constituent Unit (f1)

The "base-dissociable group" in the constituent unit (f1) is an organic group which can be dissociated by the action of a base. As the base, alkaline developers which have been generally used in the field of lithography may be exemplified. More specifically, the "base-dissociable group" is a group which can be dissociated by the action of an alkaline developer (for example, an aqueous solution of 2.38% by mass of tetramethylammonium hydroxide (TMAH) (23° C.)).

The base-dissociable group is dissociated by the action of an alkaline developer through causing hydrolysis. Thus, a hydrophilic group is formed concurrently with the dissociation of the base-dissociable group, whereby hydrophilicity of the fluorine-containing polymer compound increases, and thus affinity to the alkaline developer is improved.

The base-dissociable group is not particularly limited as long as it is an organic group as defined above, which may either include a fluorine atom or not include a fluorine atom. When a fluorine atom is not included at a position other than the base-dissociable group in the constituent unit (f1), it is necessary to be a base-dissociable group including a fluorine atom. On the other hand, when a fluorine atom is included at a position other than the base-dissociable group in the constituent unit (f1), it may be either a base-dissociable group including a fluorine atom, or a base-dissociable group not including a fluorine atom. The base-dissociable group including a fluorine atom refers to a base-dissociable group in which a portion or all of hydrogen atoms are substituted with a fluorine atom.

In the constituent unit (f1), it is preferred that the base-dissociable group includes a fluorine atom. In particular, it is preferred that the fluorine atom included in the constituent unit (f1) exists only in the base-dissociable group. When the base-dissociable group includes a fluorine atom, upon dissociation of the base-dissociable group due to the action of the alkaline developer, the fluorine atom is also dissociated from the constituent unit (f1), whereby the affinity to the alkaline developer further increases.

Specific examples of the base-dissociable group including a fluorine atom include, e.g., groups represented by the following general formulae (II-1) to (II-4). In the present invention, the base-dissociable group is preferably at least one selected from the group consisting of the groups represented by the following general formulae (II-1) to (II-4). In view of superior performance as a base-dissociable group, and ease in synthesis, the groups represented by the following general formula (II-1) or (II-4) are particularly preferred.

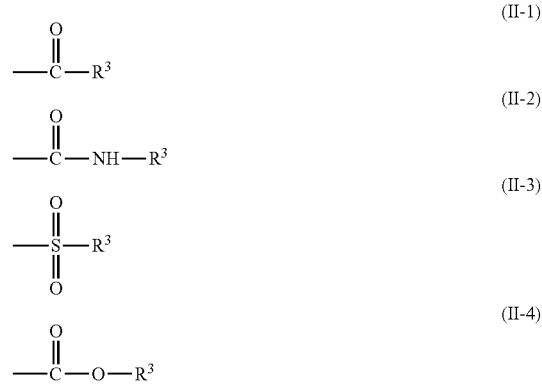

In the above general formulae (II-1) to (II-4), $R^3$ is each independently an organic group having a fluorine atom.

The "organic group" referred to herein means a group having at least one carbon atom.

The structure of $R^3$ may be any of linear, branched, or cyclic, and is preferably linear or branched. In $R^3$, the number of carbon atoms of the organic group is preferably 1 to 20, more preferably 1 to 15, particularly preferably 1 to 10, and most preferably 1 to 5. $R^3$ has a fluorination percentage of preferably no less than 25%, more preferably no less than 50%, and particularly preferably no less than 60%, since the hydrophobicity of the resist film during the liquid immersion exposure is increased. The "fluorination percentage" means a ratio (%) of (the number of fluorine atoms) with respect to (total number of hydrogen atoms and fluorine atoms) in the organic group.

$R^3$ is preferably exemplified by, for example, a fluorinated hydrocarbon group which may have a substituent. The hydrocarbon group may be either an aliphatic hydrocarbon group, or an aromatic hydrocarbon group, and an aliphatic hydrocarbon group is preferred. An aliphatic hydrocarbon group is a hydrocarbon group not being aromatic. The aliphatic hydrocarbon group may be either saturated or unsaturated, and is preferably saturated, in general.

Thus, it is preferred that $R^3$ be a fluorinated saturated hydrocarbon group or a fluorinated unsaturated hydrocarbon group, and it is particularly preferably a fluorinated saturated hydrocarbon group, i.e., a fluorinated alkyl group. The fluorinated alkyl group is exemplified by groups derived from unsubstituted alkyl groups by substituting a portion or all of hydrogen atoms with a fluorine atom. The fluorinated alkyl group may be a group derived from an unsubstituted alkyl group by substituting a portion of hydrogen atoms each with a fluorine atom, or alternatively a group derived from an unsubstituted alkyl group by substituting all of hydrogen atoms each with a fluorine atom (perfluoroalkyl group).

The substituent which may be included in the fluorinated hydrocarbon group is exemplified by an alkyl group having 1 to 5 carbon atoms, and the like.

In $R^3$, the fluorinated alkyl group is preferably a linear or branched fluorinated alkyl group. Particularly, the groups represented by the following general formula (III-1) or (III-2) are preferred, and among them, the groups represented by the formula (III-1) are preferred.

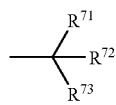
(III-2)

In the above general formula (III-1), $R^{41'}$ is an unsubstituted alkylene chain having 1 to 9 carbon atoms, and $R^{42'}$ is a fluorinated alkyl group having 1 to 9 carbon atoms. Here, total number of carbon atoms in $R^{41'}$ and $R^{42'}$ is no more than 10. Additionally, in the above general formula (III-2), $R^{71}$ to $R^{73}$ are each independently a linear alkyl group having 1 to 5 carbon atoms, and at least one of $R^{71}$ to $R^{73}$ is an alkyl group having a fluorine atom.

Examples of suitable constituent unit (f1) include constituent units represented by the following general formula (f1-1) or (f1-2).

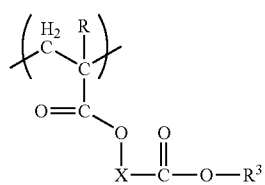
(f1-1)

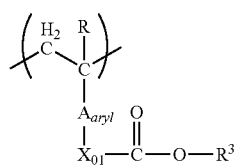
(f1-2)

In the above general formulae (f1-1) and (f1-2), R is each independently a hydrogen atom, a lower alkyl group, or a halogenated alkyl group; X is a bivalent organic group; $A_{aryl}$ is a bivalent aromatic cyclic group which may have a substituent; $X_{01}$ is a single bond or a bivalent linking group; and $R^3$ is each independently an organic group having a fluorine atom.

Among the constituent units represented by the above general formula (f1-1), suitable ones include constituent units represented by the following general formulae (f1-11) to (f1-15). Furthermore, among the constituent units represented by the above general formula (f1-2), suitable ones include constituent units represented by the following general formulae (f1-21) to (f1-26).

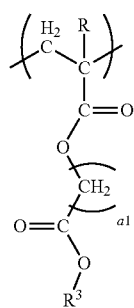
(f1-11)

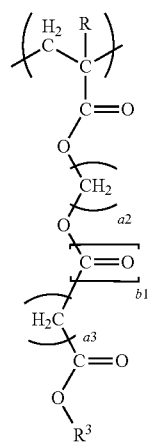
(f1-12)

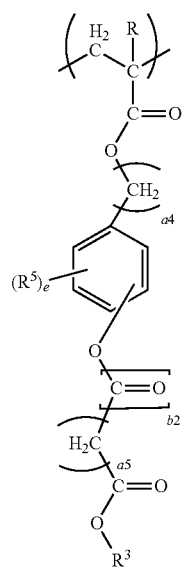
(f1-13)

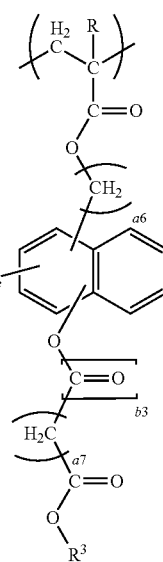
(f1-14)

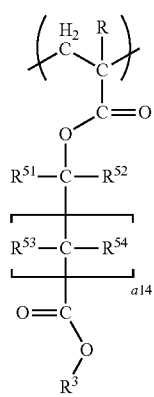
(f1-15)
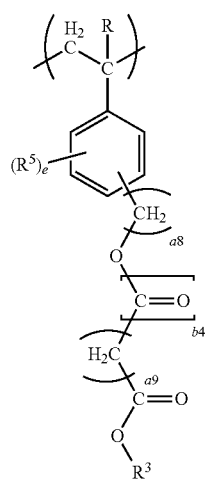
(f1-21)
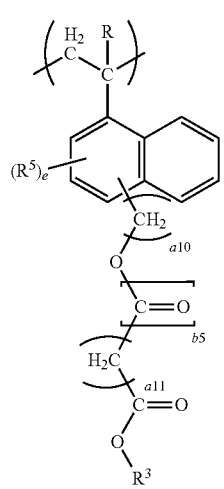
(f1-22)
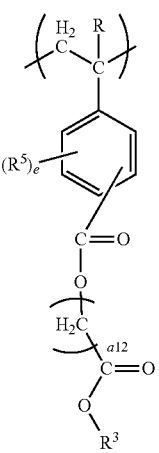
(f1-23)
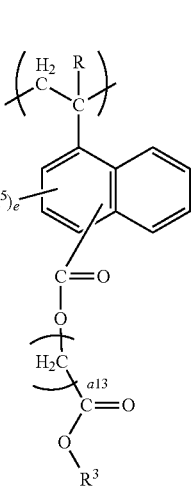
(f1-24)
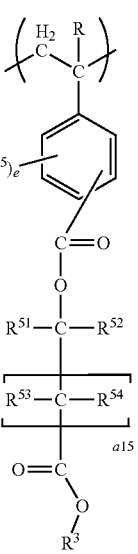
(f1-25)

-continued

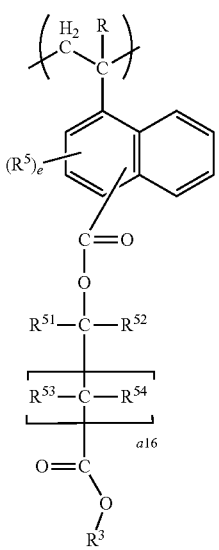

(f1-26)

In the above general formulae (f1-11) to (f1-15), and (f1-21) to (f1-26), R and $R^3$ are each as defined above; $R^{51}$ to $R^{52}$ are each independently an alkyl group having 1 to 10 carbon atoms; $R^{53}$ to $R^{54}$ are each independently a hydrogen atom or an alkyl group having 1 to 10 carbon atoms; a1 to a3, a5, a7, a9, and a11 to a13 are each independently an integer of 1 to 5; a4, a6, a8, and a10 are each independently an integer of 0 to 5; a14 to a16 are an integer of 0 to 5; b1 to b5 are each independently 0 or 1; and $R^5$ is a substituent, with e being an integer of 0 to 2.

As the constituent unit (f1), at least one selected from the group consisting of the constituent units represented by any one of the above general formulae (f1-11) to (f1-14) and (f1-21) to (f1-24) is preferred; at least one selected from the group consisting of the constituent units represented by any one of the above general formulae (f1-11) to (f1-13), (f1-21), and (f1-22) is more preferred; and at least one selected from the group consisting of the constituent units represented by the above general formula (f1-11) and (f1-22) is particularly preferred.

Among the fluorine-containing polymer compounds, one of the constituent units (f1) may be used alone, or two or more may be used in combination. The ratio of the constituent unit (f1) in the fluorine-containing polymer compound with respect to total amount of the entire constituent units that constitute the fluorine-containing polymer compound is preferably no less than 10% by mole and no greater than 90% by mole, more preferably no less than 20% by mole and no greater than 80% by mole, still more preferably no less than 30% by mole and no greater than 80% by mole, and particularly preferably no less than 40% by mole and no greater than 80% by mole. When the ratio of the constituent unit (f1) is not below the lower limit value of the aforementioned range, hydrophobicity is given during immersion exposure while hydrophilicity is given during alkali development, in formation of the resist pattern, whereby defects in connection with re-adhesion are reduced, leading to improvement of scan followability during liquid immersion exposure. When the ratio is not beyond the upper limit value, favorable balance with the constituent unit (f2) is provided, whereby defects derived from liquid immersion scan exposure can be suppressed.

Constituent Unit (f2)

The constituent unit (f2) is represented by the general formula (f2-1).

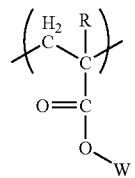

(f2-1)

In the above general formula (f2-1), R is a hydrogen atom, a lower alkyl group, or a halogenated lower alkyl group; and W is a group represented by any of the following general formulae (w-1) to (w-4).

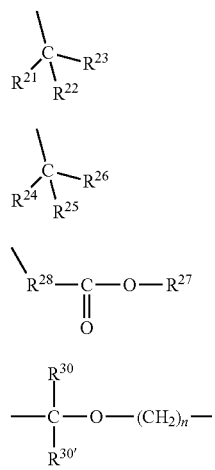

In the above general formula (w-1), $R^{21}$ is an alkyl group having no less than 2 carbon atoms, $R^{22}$ and $R^{23}$ bind to one another to form a monoalicyclic group having no less than 7 carbon atoms. In the above general formula (w-2), $R^{24}$ is a branched alkyl group having no less than 3 carbon atoms, and $R^{25}$ and $R^{26}$ bind to one another to form an alicyclic group. In the above general formula (w-3), $R^{27}$ is an acid-dissociable, dissolution-inhibiting group, and $R^{28}$ is a bivalent linking group. In the above general formula (w-4), $R^{29}$ is a linear or branched alkyl group or alicyclic group; n is an integer of 0 to 3; $R^{30}$ and $R^{30'}$ are each independently a linear or branched alkyl group or a hydrogen atom; and $R^{29}$ and $R^{30}$ may bind to one another to form an alicyclic group.

In the above general formula (w-1), the alkyl group represented by $R^{21}$ may be any of linear, branched, or cyclic. When the alkyl group is linear or branched, the number of carbon atoms is preferably 2 to 5, and when the alkyl group is cyclic, the number of carbon atoms is preferably 4 to 15, more preferably 4 to 12, and most preferably 5 to 10.

The number of carbon atoms of the monoalicyclic group formed by binding of $R^{22}$ and $R^{23}$ to one another together with the carbon atom with which the $R^{22}$ and $R^{23}$ bound is preferably no less than 7, and still more preferably no less than 8. In addition, the number of carbon atoms of the monoalicyclic group is preferably no more than 12, more preferably no more than 10, and still more preferably no more than 9.

Specific examples of preferred group represented by the general formula (w-1) include those illustrated in the following.

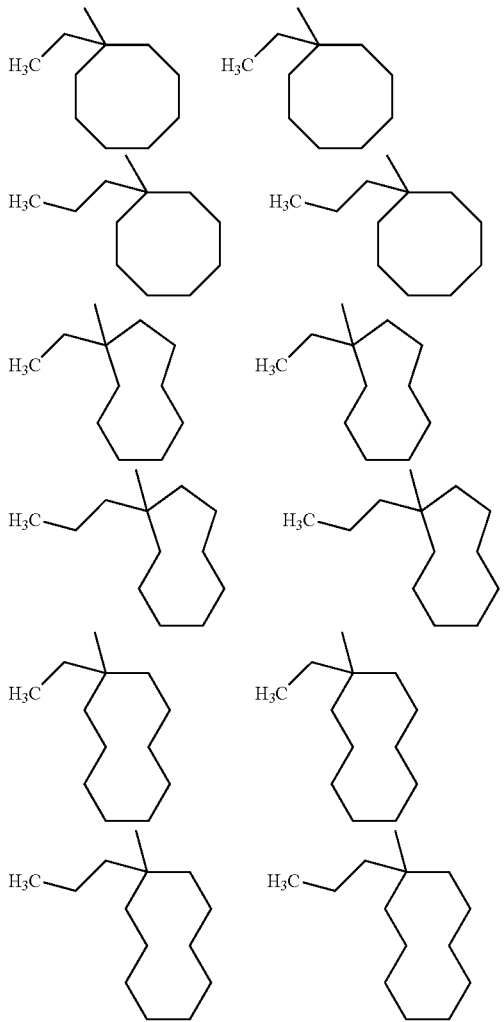

In the above general formula (w-2), the alkyl group represented by $R^{24}$ has carbon atoms of preferably 3 to 10, and more preferably 3 to 5. The number of carbon atoms of the alicyclic group formed by binding of $R^{25}$ and $R^{26}$ bind to one another together with the carbon atom with which the $R^{25}$ and $R^{26}$ bound is preferably 4 to 15, more preferably 4 to 12, and most preferably 5 to 10.

Specific examples of the group represented by the general formula (w-2) include those illustrated in the following.

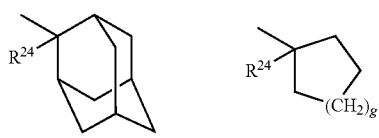

In the above general formula, $R^{24}$ is as defined above, and g is an integer of 0 to 3.

The integer g is more preferably 1 to 3, and still more preferably 1 or 2.

In the general formula (w-3), the acid-dissociable, dissolution-inhibiting group represented by $R^{27}$ has acid dissociability, i.e., a property enabling dissociation when the fluorine-containing polymer compound is blended into a resist composition together with an acid generator component, due to the action of an acid generated from the acid generator component upon exposure, and in addition, this acid-dissociable, dissolution-inhibiting group also has alkali dissolution-inhibitory property, i.e., a property enabling suppression of the solubility of the fluorine-containing polymer compound in an alkaline developer before the dissociation. The acid-dissociable, dissolution-inhibiting group represented by $R^{27}$ is not particularly limited, and any one proposed hitherto as an acid-dissociable, dissolution-inhibiting group of a base resin for chemically amplified resists may be used.

In the present invention, the bivalent linking group represented by $R^{28}$ is preferably a bivalent linking group having an alkylene chain, a bivalent alicyclic group, or a hetero atom.

In the general formula (w-4), when $R^{29}$ is linear or branched, the number of carbon atoms is preferably 1 to 15, and more preferably 1 to 5; and $R^{29}$ is still more preferably an ethyl group or a methyl group, and most preferably an ethyl group. When $R^{29}$ is an alicyclic group, it may be appropriately selected from among a large number of mono- or poly-alicyclic groups conventionally proposed for ArF resists and the like, for use as the alicyclic group. The number of carbon atoms of the alicyclic group in $R^{29}$ is preferably 4 to 15, more preferably 4 to 12, and most preferably 5 to 10.

The integer represented by n is 0 to 3, more preferably 0 to 2, still more preferably 0 or 1, and most preferably 0. $R^{30}$ and $R^{30'}$ are each independently a linear or branched alkyl group or a hydrogen atom. The linear or branched alkyl group in $R^{30}$ and $R^{30'}$ is preferably a lower alkyl group. In the present invention, it is preferred that at least one of $R^{30}$ and $R^{30'}$ be a hydrogen atom.

Also, in the above general formula (w-4), $R^{29}$ and $R^{30}$ may bind to one another to form an alicyclic group. In this case, the alicyclic group is formed from $R^{29}$ and $R^{30}$ and —O—$(CH_2)_n$—, via a carbon atom to which $R^{30}$ is bound. The alicyclic group is preferably a 4-membered ring to a 7-membered ring, and more preferably a 4-membered ring to a 6-membered ring.

Specific examples of preferable group represented by the formula (w-4) include groups represented by the following formulae (w-4-1) to (w-4-12), and the like.

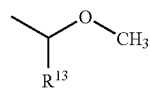  (w-4-1)

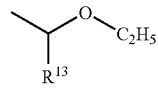  (w-4-2)

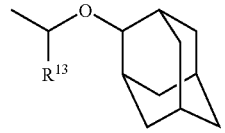  (w-4-3)

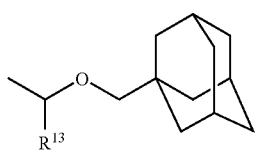
(w-4-4)

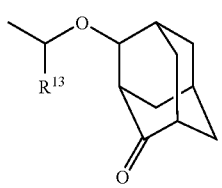
(w-4-5)

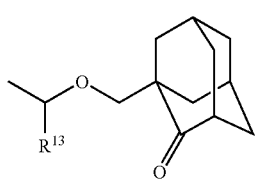
(w-4-6)

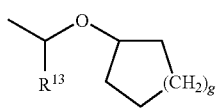
(w-4-7)

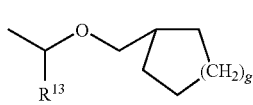
(w-4-8)

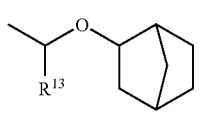
(w-4-9)

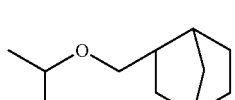
(w-4-10)

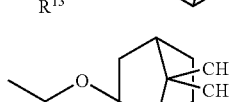
(w-4-11)

(w-4-12)

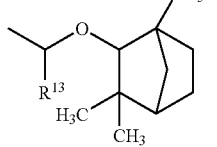

In the above general formulae (w-4-1) to (w-4-12), $R^{13}$ is a hydrogen atom or a methyl group, and g is as defined above.

In the fluorine-containing polymer compound, the constituent unit (f2) may be used alone, or two or more may be used in combination. In the fluorine-containing polymer compound, the ratio of the constituent unit (f2), with respect to total amount of the entire constituent units that constitute the fluorine-containing polymer compound is preferably no less than 5% by mole and no greater than 80% by mole, more preferably no less than 10% by mole and no greater than 60% by mole, still more preferably no less than 15% by mole and no greater than 50% by mole, and particularly preferably no less than 20% by mole and no greater than 40% by mole. When the ratio of the constituent unit (f2) is not below the lower limit value of the aforementioned range, more prominent characteristic in formation of the resist pattern, of giving improved hydrophilicity when exposure and PEB are carried out while giving hydrophobicity during immersion exposure may be exhibited. In addition, bridge defects can be suppressed in line-and-space patterns, while deteriorated opening defects can be suppressed in contact hole patterns. Moreover, the ratio of the hydrocarbon group increases, whereby scan followability is improved. When the ratio is not beyond the upper limit value, favorable balance with the constituent unit (f1) is provided.

Other Constituent Unit

The fluorine-containing polymer compound may have a constituent unit (hereinafter, referred to as constituent unit (f3)) other than the constituent unit (f1) and constituent unit (f2) in the range not to deteriorate the effects of the present invention. The constituent unit (f3) is not particularly limited, and any constituent unit derived from a compound that is copolymerizable with a compound that derives the constituent unit (f1) and with a compound that derives the constituent unit (f2) may be employed. As such a constituent unit, any one proposed hitherto as a constituent unit of a base resin for chemically amplified resists may be exemplified.

In the present invention, the fluorine-containing polymer compound is preferably a copolymer having the constituent unit (f1) and the constituent unit (f2). The copolymer may be exemplified by a copolymer having only the constituent unit (f1) and the constituent unit (f2); a copolymer having the constituent unit (f1), the constituent unit (f2) and the constituent unit (f3), and the like. In the present invention, the fluorine-containing polymer compound is preferably a copolymer having the constituent unit (f1) and the constituent unit (f2).

Although the mass-average molecular weight (Mw: equivalent polystyrene mass-average molecular weight determined by gel permeation chromatography) of the fluorine-containing polymer compound is not particularly limited, it is preferably no lower than 2,000 and no higher than 50,000, more preferably no lower than 3,000 and no higher than 30,000, and most preferably no lower than 4,000 and no higher than 25,000. When the mass-average molecular weight is no higher than the upper limit value of this range, solubility into the resist solvent sufficient for use as a resist can be attained, while the mass-average molecular weight being no lower than the lower limit value of this range leads to favorable resistance to dry etching as well as superior cross-sectional shape of the resist pattern. In addition, the dispersity index (Mw/Mn) is preferably no less than 1.0 and no greater than 5.0, more preferably no less than 1.0 and no greater than 3.0, and most preferably no less than 1.2 and no greater than 2.5. It should be noted that Mn represents a number average molecular weight.

Content of Fluorine-containing Polymer Compound

The content of the fluorine-containing polymer compound in the resist composition for liquid immersion exposure based on 100 parts by mass of the base material component is preferably no lower than 0.1 parts by mass and no higher than 50 parts by mass, more preferably no lower than 0.1 parts by mass and no higher than 40 parts by mass, particularly preferably no lower than 0.5 parts by mass and no higher than 30 parts by mass, and most preferably no lower than 1 part by mass and no higher than 15 parts by mass. By attaining the content being no lower than the lower limit value of the above range, the hydrophobicity of the resist film formed using the resist composition for liquid immersion exposure is improved, whereby hydrophobicity being appropriate for use as a liquid immersion exposure can be provided. When the content is no higher than the upper limit value, lithography characteristics can be improved.

Base Material Component (A)

As the base material component, an organic compound which has been generally employed as a base material component for a chemically amplified resist can be used alone, or as a mixture of two or more thereof. The term "base material component" herein means an organic compound having a film forming ability, and preferably, an organic compound having a molecular weight of no lower than 500 may be used. The organic compound having a molecular weight of no lower than 500 improves film forming ability, and is likely to enable formation of a nano-scale resist pattern.

The organic compound having a molecular weight of no lower than 500 which may be used as the base material component described above is generally classified into organic compounds having a low molecular weight of no lower than 500 and lower than 2,000 (low molecular weight material), and organic compounds having a high molecular weight of no lower than 2,000 (high molecular weight material). As the low molecular weight material, a nonpolymer is generally used. As the high molecular weight material, a resin (polymer, copolymer) is used. In the case in which a resin is used, the "molecular weight" employed is a value in terms of the mass-average molecular weight equivalent to polystyrene determined by GPC (gel permeation chromatography). Hereinafter, by referring merely to "resin", a resin having a molecular weight of no lower than 2,000 is indicated. As the base material component, a resin having an alkaline solubility that will be altered by the action of an acid may be used; a low molecular material having an alkaline solubility that will be altered by the action of an acid may be used, or these may be used in combination.

When the resist composition for liquid immersion exposure is a negative resist composition, a base material component that is soluble in an alkaline developer is used as the base material component, and a crosslinking agent is further blended in the negative resist composition. In such a negative resist composition, when an acid is generated from the acid generator component upon exposure, crosslinking occurs between the base material component and the crosslinking agent by the action of the acid, thereby leading to alteration into becoming insoluble in the alkali photographic developer. Thus, in forming a resist pattern, when a resist film obtained by applying the negative resist composition on a substrate is selectively exposed, the exposed part becomes insoluble in the alkaline developer, whereas the unexposed part remains unchanged as soluble in the alkaline developer, thereby enabling formation of the resist pattern by development with an alkali.

When the resist composition for liquid immersion exposure used in the present invention is a negative resist composition, a resin that is soluble in an alkaline developer (hereinafter, referred to as alkali-soluble resin) is generally used as the base material component. A resin having a unit derived from at least one selected from an α-(hydroxyalkyl)acrylic acid, and a lower alkyl ester of an α-(hydroxyalkyl)acrylic acid is preferred as the alkali-soluble resin since a favorable resist pattern with less swelling can be formed. The α-(hydroxyalkyl)acrylic acid refers to one or both of: acrylic acid having a hydrogen atom bound to a carbon atom at the α-position to which a carboxy group is bound, and α-hydroxyalkyl acrylic acid having a hydroxyalkyl group (preferably a hydroxyalkyl group having 1 to 5 carbon atoms) bound to the carbon atom at the α-position.

As the crosslinking agent, for example, an amino based crosslinking agent such as glycoluril having a methylol group or an alkoxymethyl group is preferably used in general, since a favorable resist pattern with less swelling can be formed. The amount of the crosslinking agent to be blended is preferably 1 to 50 parts by mass based on 100 parts by mass of the alkali-soluble resin.

When the resist composition for liquid immersion exposure used in the present invention is a positive resist composition, a base material component having a solubility in an alkaline developer that will increase by the action of an acid may be used as the base material component. The base material component is insoluble in an alkaline developer before the exposure, and when an acid is generated from the acid generator component upon the exposure, a solubility in the alkaline developer increases by the action of the acid. Therefore, when a resist film obtained by applying the positive resist composition on a substrate is selectively exposed in forming a resist pattern, the exposed part is altered to become soluble from insoluble in an alkaline developer, whereas the unexposed part remains unchanged as alkali-insoluble. Thus, the alkali development enables formation of the resist pattern. The resist composition for liquid immersion exposure used in the present invention is preferably a positive resist composition. That is, in the resist composition for liquid immersion exposure used in the present invention, the base material component is preferably a base material component having a solubility in an alkaline developer that will increase by the action of an acid. The base material component may be: a resin component (A1) having a solubility in an alkaline developer that will increase by the action of an acid (hereinafter, may be referred to as "component (A1)"); a low molecular weight material (A2) having a solubility in an alkaline developer that will increase by the action of an acid (hereinafter, may be referred to as "component (A2)"); or any mixture of the same. In the present invention, the component (A1) is particularly preferably used.

Resin Component (A1) Having Solubility in Alkaline Developer that Will Increase by the Action of Acid As the component (A1), generally, a resin component (base resin) which has been employed as a base material component for a chemically amplified resist can be generally used alone, or as a mixture of two or more thereof. In the present invention, those having a constituent unit derived from an acrylic ester are preferred as the component (A1). The term "constituent unit derived from an acrylic ester" referred to herein means a constituent unit constituted following cleavage of an ethylenic unsaturated double bond of an acrylic ester. With respect to the term "acrylic ester" according to the conception herein, in addition to acrylic esters having a hydrogen atom bound to the carbon atom at the α-position, those having a substituent (an atom other than a hydrogen atom, or a group) bound to the carbon atom at the α-position are also included. The substituent includes a lower alkyl group, a halogenated lower alkyl group, and the like. The term α-position of the constituent unit derived from an acrylic ester (carbon atom at the α-position) means, unless otherwise stated particularly, a carbon atom to which a carbonyl group is bound. In the present invention, it is preferred that a hydrogen atom, a lower alkyl group, or a halogenated lower alkyl group is bonded to the α-position of the acrylic ester; a hydrogen atom, a lower alkyl group, or a fluorinated lower alkyl group is more preferably bonded thereto; and in view of industrial availability, a hydrogen atom or a methyl group is most preferably bonded thereto.

It is particularly preferred that the component (A1) has a constituent unit (a1) derived from an acrylic ester including an acid-dissociable, dissolution-inhibiting group. Moreover, it is preferred that the component (A1) further has, in addition to the constituent unit (a1), a constituent unit (a2) derived from an acrylic ester including a lactone-containing cyclic group. Furthermore, it is preferred that the component (A1) further has, in addition to the constituent unit (a1) or to the constituent units (a1) and (a2), a constituent unit (a3) derived from an acrylic ester including a polar group-containing aliphatic hydrocarbon group. In addition, the component (A1) may also have a constituent unit (a4) other than the aforementioned constituent units (a1) to (a3).

Although the mass-average molecular weight (Mw) (equivalent polystyrene mass-average molecular weight determined by gel permeation chromatography) of the component (A1) is not particularly limited, it is preferably no lower than 2,000 and no higher than 50,000, more preferably no lower than 3,000 and no higher than 30,000, and most preferably no lower than 5,000 and no higher than 20,000. When the mass-average molecular weight is lower than the upper limit of the above range, sufficient solubility in the resist solvent for use as a resist is achieved, whereas when the mass-average molecular weight is higher than the lower limit of this range, favorable resistance to dry etching and superior cross-sectional shape of the resist pattern are attained. The dispersity index (Mw/Mn) is preferably no less than 1.0 and no greater than 5.0, more preferably no less than 1.0 and no greater than 3.0, and most preferably no less than 1.2 and no greater than 2.5. It should be noted that Mn indicates number-average molecular weight.

Low Molecular Weight Material (A2) Having Solubility in Alkaline Developer that Will Increase by Action of Acid As the component (A2), a low molecule compound having a molecular weight of no lower than 500 and no higher than 2,000 and having a hydrophilic group, and also having an acid-dissociable, dissolution-inhibiting group is preferred.

Specifically, compounds having a plurality of phenol skeletons in which a portion of hydrogen atoms in the hydroxyl groups is substituted with the acid-dissociable, dissolution-inhibiting group described above may be exemplified. It is preferred that the component (A-2) be, for example, a low-molecular weight phenol compound known as a sensitizer or a heat resistance improving agent in non-chemically amplified g-ray or i-ray resists, in which a portion of hydrogen atoms in the hydroxyl groups is substituted with the acid-dissociable, dissolution-inhibiting group. The component (A-2) may be used from among such compounds arbitrarily.

Acid Generator Component (B)

The acid generator component is not particularly limited, and those proposed hitherto as an acid generator for chemically amplified resists can be used. As such an acid generator, a wide variety of those have been conventionally known such as: onium salt based acid generators such as iodonium salts and sulfonium salts; oxime sulfonate based acid generators; diazomethane based acid generators such as bisalkyl or bisarylsulfonyl diazomethanes and poly (bissulfonyl)diazomethanes; nitrobenzyl sulfonate based acid generators; iminosulfonate based acid generators; disulfone based acid generator; and the like.

As the acid generator component, one of these acid generators may be used alone, or two or more may be used in combination. In the present invention, it is preferred that an onium salt having a fluorinated alkylsulfonate ion as an anion be used as the acid generator component, among these. The content of the acid generator component in the resist composition for liquid immersion exposure used in the present invention is preferably no lower than 0.5 parts by mass and no higher than 30 parts by mass, and more preferably no lower than 1 part by mass and no higher than 15 parts by mass, based on 100 parts by mass of the base material component. By making the abovementioned range, sufficient pattern forming is performed. In addition, preferred is that a homogeneous solution can be obtained, and favorable storage stability is achieved.

Optional Component

The resist composition for liquid immersion exposure used in the present invention may also contain a nitrogen-containing organic compound (D) as an optional component in order to improve resist pattern configuration, and post exposure temporal stability, and the like. As the nitrogen-containing organic compound, a wide variety of compounds have already been proposed; and an arbitrarily selected compound from known compounds can be used. Among all, aliphatic amines, in particular, secondary aliphatic amines and tertiary aliphatic amines may be preferably used. The aliphatic amine referred to herein means an amine having one or more aliphatic groups, in which the aliphatic group preferably has 1 to 20 carbon atoms.

Examples of the aliphatic amine include amine (alkylamine or alkylalcoholamine) yielded by substituting at least one hydrogen atom of ammonia with an alkyl group or a hydroxyalkyl group having 20 or less carbon atoms, or cyclic amine. Examples of the cyclic amine include heterocyclic compounds having a nitrogen atom as a hetero atom. The heterocyclic compound may be either monocyclic (aliphatic monocyclic amine) or polycyclic (aliphatic polycyclic amine). These may be used alone, or in combination of two or more thereof.

The nitrogen-containing organic compound is used generally in the range of no less than 0.01 parts by mass and no greater than 5.0 parts by mass based on 100 parts by mass of the base material component.

In order to prevent deterioration of sensitivity, and to improve the resist pattern configuration and enhance the post exposure temporal stability, and the like, at least one compound (E) selected from the group consisting of an organic carboxylic acid, and phosphorus oxoacid and a derivative thereof (hereinafter, may be referred to as "component (E)") may be incorporated as an optional component into the resist composition for liquid immersion exposure used in the present invention. The component (E) is used generally at a ratio of no less than 0.01 parts by mass and no greater than 5.0 parts by mass based on 100 parts by mass of the base material component.

The resist composition of the present invention may further contain if desired additives with miscibility such as, for example, an additional resin for improving the characteristics of a resist film; a surfactant for improving coating abilities, a dissolution-preventing agent, a plasticizer, a stabilizer, a colorant, a halation inhibitor, a dye, and the like by appropriately adding the same.

Organic Solvent (S)

The resist composition for liquid immersion exposure used in the present invention may be prepared by dissolving the materials in an organic solvent. As the organic solvent, any one that can dissolve each component used and make a homogeneous solution can be used, and any one or more solvents that are selected from a group of conventionally known solvents for chemically amplified resists can be used. The amount of the organic solvent is not particularly limited, and is adjusted appropriately within a range of concentrations that allows application to a support in accordance with coating film thickness, and in general, the organic solvent may be used so as to make the solid content of the resist composition fall within the range of no lower than 2% by mass and no higher than 20% by mass, and preferably no lower than 3% by mass and no higher than 15% by mass.

Contact Angle of Water with Resist Film

The hydrophobicity of the resist film to be a subject of application of the resist surface modifying liquid of the present invention can be evaluated by determining a contact angle of water, for example static contact angle (angle formed between a water droplet surface and a resist film surface on the resist film in a horizontal state), a dynamic contact angle (which may include a contact angle determined while the resist film is inclined, when the water droplet starts falling (sliding angle), a contact angle at the forward end point in the falling direction of the water droplet (advancing angle), and a contact angle at the rear end point in the falling direction (receding angle)), and the like. For example, as the hydrophobicity of the resist film is higher, the static contact angle, the advancing angle, and the receding angle become greater, while the sliding angle becomes smaller.

Herein, the static contact angle, the advancing angle, the receding angle, and the sliding angle are determined as in the following. First, a resist film is formed by spin coating a resist composition solution on a silicon substrate, and thereafter heating under a temperature condition of 110° C. for 60 sec. Next, the resist film is subjected to a measurement with a commercially available measuring device such as DROP-MASTER-700 (product name, manufactured by Kyowa Interface Science Co., Ltd.), AUTO SLIDING ANGLE: SA-30DM (product name, manufactured by Kyowa Interface Science Co., Ltd.), AUTO DISPENSER: AD-31 (product name, manufactured by Kyowa Interface Science Co., Ltd.) etc, thereby enabling the determination.

When the resist composition for liquid immersion exposure is used as a resist composition, the measured value of the static contact angle before carrying out exposure and development on the resist film obtained using the resist composition for liquid immersion exposure is preferably no less than 70 degrees, more preferably no less than 70 degrees and no greater than 100 degrees, and particularly preferably no less than 75 degrees and no greater than 100 degrees. When the static contact angle is no less than the value of the lower limit, the effect of inhibiting elution of substances in immersion exposure can be improved. Although the reason is not clear, a relationship with the hydrophobicity of the resist film is conceived as one main factor. More specifically, it is speculated that high hydrophobicity may influence the possibility that the liquid for liquid immersion exposure can be removed from the resist film surface immediately after removing the liquid for liquid immersion exposure, following carrying out immersion exposure, since an aqueous material such as water is used in the liquid for liquid immersion exposure. In addition, when the receding angle is no greater than the upper limit value, favorable lithography characteristics and the like can be achieved.

On a similar reason, according to the resist composition for liquid immersion exposure used in the present invention, the measured value of the receding angle before carrying out the exposure and development on the resist film obtained using the resist composition for liquid immersion exposure is preferably no less than 50 degrees, more preferably no less than 50 degrees and no greater than 150 degrees, particularly preferably no less than 50 degrees and no greater than 130 degrees, and most preferably no less than 53 degree and no greater than 100 degree. In addition, according to the resist composition used in the present invention, the measured value of the sliding angle before carrying out the exposure and development on the resist film obtained using the resist composition for liquid immersion exposure is preferably no greater than 30 degrees, more preferably no less than 5 degrees and no greater than 30 degrees, particularly preferably no less than 5 degrees and no greater than 25 degrees, and most preferably no less than 5 degree and no greater than 23 degree. When the sliding angle is no greater than the upper limit value, the effect of inhibiting elution of substances in immersion exposure can be improved. Whereas, when the sliding angle is no less than the lower limit value, favorable lithography characteristics and the like can be achieved.

The values of the aforementioned various angles (dynamic contact angle (advancing angle, receding angle, sliding angle etc.), and static contact angle) can be adjusted by regulating the blend composition of the resist composition for liquid immersion exposure, for example, type and blending amount of the fluorine-containing polymer compound, type of the base material component, and the like. For example, as the content of the fluorine-containing polymer compound is higher, the hydrophobicity of the resulting resist composition is elevated, whereby the advancing angle, the receding angle, and the static contact angle become greater, while the sliding angle becomes smaller.

Formation of Resist Film

In the method for forming a resist pattern of the present invention, the resist film is formed by carrying out prebaking (post applying baking (PAB) treatment) after applying the resist composition with a spinner or the like on a substrate.

The substrate is not particularly limited, and a conventionally well-known substrate can be used. For example, a substrate for electronic parts, a substrate for electronic parts on which a predetermined wiring pattern is formed, and the like can be exemplified. More specifically, examples of the substrate include silicon wafers, substrates made of a metal such as copper, chromium, iron or aluminum, glass substrates, and the like. As the material of the wiring pattern, for example, copper, aluminum, nickel, gold or the like can be used.

Also, the substrate as described above on which at least one of inorganic and organic films is provided may be employed. As the inorganic film, inorganic anti reflection films (inorganic BARC) may be exemplified. As the organic film, organic antireflection films (organic BARC) as well as organic films such as lower layer organic films in a multilayer resist method may be exemplified. The multilayer resist method herein refers to a method in which an organic film of at least one layer (lower layer organic film), and a resist film of at least one layer (upper layer resist film) are provided on a substrate, and patterning of the lower layer organic film is carried out using a resist pattern formed on the upper layer resist film as a mask. This method reportedly enables a pattern with a high aspect ratio to be formed. In other words, according to the multilayer resist method, a necessary thickness can be secured by placing the lower layer organic film, and thus the resist film can be thinned, whereby formation of a micropattern with a high aspect ratio is enabled. The multilayer resist method is classified fundamentally into: a method to provide a bilayer structure including the upper layer resist film and the lower layer, organic film (two-layer resist method); and a method to provide a multilayer structure including three or more layers by placing one or more inter layer(s) (metal thin film or the like) between the upper layer resist film and the lower layer organic film.

After forming the resist film, an organic antireflection film can be further provided on the resist film to form a three-layered laminate including a substrate, a resist film, and an antireflection film. The antireflection film provided on the resist film is preferably soluble in an alkaline developer. The foregoing steps may be carried out using well-known procedures, and it is preferable that the operation conditions etc., are appropriately set according to the blend composition and characteristics of a resist composition used.

Exposure

Next, the resist film obtained as described above is selectively exposed through a desired mask pattern. In the present invention, when a resist film formed from the resist composition for liquid immersion exposure described above is used as a resist film in particular, exposure on the resist film should be carried out with liquid immersion exposure (liquid immersion lithography).

In this liquid immersion exposure, the exposure (immersion exposure) is conducted in a state in which a solvent (liquid for liquid immersion exposure) that has a larger refractive index than that of air is previously filled between the resist film and the lens placed at the lowest position on the lithography device.

The wavelength employed in the exposure is not particularly limited, and a radiation such as ArF excimer laser, KrF excimer laser, $F_2$ laser and the like can be used. The resist film used in the present invention may be effectively employed together with a KrF excimer laser or an ArF excimer laser, in particular an ArF excimer laser.

As the liquid for liquid immersion exposure, a solvent having a refractive index greater than that of the air, and less than that of the resist film formed using the aforementioned resist composition for liquid immersion exposure is preferred. The refractive index of such a solvent is not particularly limited as long as it falls within the range as described above. The refractive index greater than that of the air, and less than that of the aforementioned resist film is acceptable.

Examples of the solvent include water, fluorocarbon inert liquids, silicon based solvents, hydrocarbon based solvents, and the like. Specific examples of the fluorocarbon inert liquid include liquids composed mainly of a fluorine-based compound such as $C_3HCl_2F_5$, $C_4F_9OCH_3$, $C_4F_9OC_2H_5$ and $C_5H_3F_7$. The fluorocarbon inert liquid has a boiling point of preferably no lower than 70° C. and no higher than 180° C., and more preferably no lower than 80° C. and no higher than 160° C. When the fluorocarbon inert liquid has a boiling point falling within the above range, the medium used in the liquid immersion can be eliminated by a simple process after completing the exposure.

The fluorocarbon inert liquid is particularly preferably a perfluoroalkyl compound in which all hydrogen atoms of the alkyl group are each substituted with a fluorine atom. Specific examples of the perfluoroalkyl compound include perfluoroalkyl ether compounds and perfluoroalkylamine compounds. More specifically, perfluoro(2-butyl-tetrahydrofuran) (boiling point: 102° C.) may be exemplified as the perfluoroalkyl ether compound, while perfluorotributylamine (boiling point: 174° C.) may be exemplified as the perfluoroalkylamine compound.

The resist composition for liquid immersion exposure used in the present invention is less likely to be adversely affected by water, in particular, and is superior also in lithography characteristics in terms of sensitivity, resist pattern configuration and the like. Therefore, water may be preferably used as the liquid for liquid immersion exposure in the present invention. In addition, water is preferably used from the viewpoint of cost, safety, environmental issues, and general purpose properties.

Treatment with Resist Surface Modifying Liquid

In the treatment with the resist surface modifying liquid, the resist surface modifying liquid of the present invention is brought into contact with a resist film after the exposure. As the method for bringing the resist surface modifying liquid into contact with the resist film after the exposure, for example: a method in which the resist surface modifying liquid is provided on the surface of the resist film by a spray coating method or the like, and thereafter the excess liquid is aspirated under reduced pressure; a method in which the laminate is immersed in the resist surface modifying liquid; a method in which the resist surface modifying liquid is applied on the resist film by a spin coating method; and the like may be exemplified. Among these, a method in which the resist surface modifying liquid is applied on the resist film by a spin coating method is preferred.

Post Exposure Baking

After completing the treatment with the resist surface modifying liquid, post exposure baking (PEB) is carried out. PEB is, in general, carried out under a condition of a temperature of from 80° C. to 150° C., for from 40 sec to 120 sec, and preferably from 60 sec to 90 sec.

Development

Subsequently, an alkali photographic developer constituted with an aqueous alkaline solution, for example, an aqueous solution of 0.1 to 10% by mass of tetramethylammonium hydroxide (TMAH) is used to carry out a development process.

Rinsing and Drying

After the development, rinsing is carried out preferably using pure water. The rinsing process with water can be carried out by, for example, dripping or spraying water over the surface of the resist pattern while rotating, thereby washing away the photographic developer and the resist composition dissolved by the photographic developer being present on the resist pattern. Then, a resist pattern, in which a resist film is patterned in a shape corresponding to a mask pattern, is obtained by drying.

EXAMPLES

Hereinafter, the present invention will be explained in detail by way of Examples. It should be noted that the present invention is not in anyway limited to the Examples demonstrated in the following.

Preparation Example 1

To a mixed solvent including 30 parts by mass of diisoamyl ether and 70 parts by mass of methylisobutyl carbinol, was added "EF-N301" (product name, a compound represented by the above formula (5a), manufactured by Jemco Co., Ltd.) as an acidic compound to give a final content of 100 ppm, whereby a resist surface modifying liquid was prepared.

Preparation Example 2

A resist surface modifying liquid was prepared in a similar manner to Example 1 except that "EF-N111" (product name, a compound represented by the above formula (4c), manufactured by Jemco Co., Ltd.) was used as an acidic compound, in place of "EF-N301".

Preparation Example 3

To 100 parts by mass of methylisobutyl carbinol as a solvent was added "EF-N301" (product name, a compound represented by the above formula (5a), manufactured by Jemco Co., Ltd.) as an acidic compound to give a final content of 100 ppm, whereby a resist surface modifying liquid was prepared.

Preparation Example 4

To 100 parts by mass of methylisobutyl carbinol as a solvent was added "methanesulfonic acid" as an acidic compound to give a final content of 200 ppm, whereby a resist surface modifying liquid was prepared.

Preparation Example 5

To 100 parts by mass of methylisobutyl carbinol as a solvent was added "acetic acid" as an acidic compound to give a final content of 1,000 ppm, whereby a resist surface modifying liquid was prepared.

Comparative Preparation Example 1

A resist surface modifying liquid was prepared by mixing 30 parts by mass of diisoamyl ether with 70 parts by mass of methylisobutyl carbinol.
Evaluation A resist composition for liquid immersion exposure "TArF-TAI-6103" (product name, manufactured by Tokyo Ohka Kogyo Co., Ltd.) was applied on a 200-mm silicon wafer (uncoated with adhesion promoter HMDS) by a spin coating method, and heated at 110° C. for 60 sec to form a resist film having a film thickness of 110 nm. The resist film was exposed with patterning light beam through a mask, and was spin coated with each resist surface modifying liquid of Preparation Examples 1 to 5, and Comparative Preparation Example 1, followed by heating at 110° C. for 60 sec (Examples 1 to 5, and Comparative Example 1, respectively). These were subjected to development with the aqueous solution of 2.38% tetramethylammonium hydroxide. The static contact angle of the surface of the resist film after the development was measured using contact angle meters "DROP MASTER-700", "AUTO SLIDING ANGLE: SA-30DM", and "AUTO DISPENSER: AD-31" (all product names, manufactured by Kyowa Interface Science Co., Ltd.). In addition, with respect to the resist film after the development, the number of defects in the wafer was measured using a surface defect inspection system "KLA-2132" (manufactured by KLA TENCOR Corporation).

It should be noted that in Comparative Example 2, the static contact angle and the number of defects after the development herein were measured after carrying out the exposure and the development, without bringing the resist surface modifying liquid into contact with the resist film. Similarly, the static contact angle and the number of defects after the development were measured in Reference Example 1 after carrying out the exposure and the development under similar conditions to those described above, without bringing the resist surface modifying liquid into contact with the resist laminate produced by applying a composition for forming a resist protective film for liquid immersion exposure "TILC-057" (product name, manufactured by Tokyo Ohka Kogyo Co., Ltd.) on the upper layer of the resist film to give a film thickness of 35 nm.

The results in the foregoing are shown in Table 1.

TABLE 1

|  | Static contact angle (°) | Number of defects |
|---|---|---|
| Example 1 | 70.4 | 30 |
| Example 2 | 71.1 | 36 |
| Example 3 | 72.4 | 7 |
| Example 4 | 71.3 | 71 |
| Example 5 | 68.9 | 408 |
| Comparative Example 1 | 66.9 | 125,000 |
| Comparative Example 2 | 88.3 | 10,431 |
| Reference Example 1 | 72.2 | 36 |

As is clear from Table 1, in Examples 1 to 5 in which the resist surface modifying liquid of the present invention was brought into contact with a resist film, smaller contact angle was exhibited as compared with Comparative Example 2 in which the resist surface modifying liquid was not brought into contact with the resist film. In addition, the number of defects also decreased significantly as compared with Comparative Example 2, and Comparative Example 1 in which the resist surface modifying liquid not containing an acidic compound was brought into contact with the resist film, revealing similar results to those when a resist protective film for liquid immersion exposure was formed.

Accordingly, it was proven that by bringing the resist surface modifying liquid of the present invention into contact with a resist film, the contact angle of the resist film after the development can be reduced, and that occurrence of defects can be inhibited.

What is claimed is:

1. A method for forming a resist pattern comprising the steps of selectively exposing a resist film formed on a substrate;
   contacting the resist film after the exposure with a resist surface modifying liquid prior to a post exposure baking (PEB) step,
   wherein the resist surface modifying liquid comprises:
   an acidic compound, and
   at least one solvent selected from the group consisting of (i) an alcohol-based solvent represented by the following formula (1) and (ii) an ether-based solvent represented by the following formula (2):

$$R^1\text{—OH} \tag{1}$$

$$R^2\text{—O—}R^3 \tag{2}$$

wherein, in the formulae (1) and (2), $R^1$, $R^2$, and $R^3$ each represent a linear or branched alkyl group, and $R^2$ and $R^3$ may bind to one another to form a ring structure, and
   wherein the total content of the acidic compound and the solvent is not lower than 80% by mass of the total content of the resist surface modifying liquid; and
   developing the resist film after the contact with the resist surface modifying liquid to form the resist pattern.

2. The method according to claim 1, wherein the content of the acidic compound is no lower than 0.001% by mass and no higher than 10% by mass.

3. The method according to claim 1, wherein the acidic compound is an organic acid.

4. The method according to claim 3, wherein the acidic compound is an organic acid in which a portion or all hydrogen atom(s) in its hydrocarbon group is/are substituted with a fluorine atom.

5. The method according to claim 1, wherein the alcohol-based solvent is at least one selected from the group consisting of methylisobutyl carbinol, isobutanol, n-butanol, 2-methyl-1-butanol, isopentanol, 2-ethylbutanol, and 3-methyl-3-pentanol.

6. The method according to claim 1, wherein the ether-based solvent is at least one selected from the group consisting of diisoamyl ether, di-n-butyl ether, diisobutyl ether, di-s-butyl ether, di-n-pentyl ether, di-t-amyl ether, and di-n-hexyl ether.

7. The method according to claim 1, wherein the resist film is formed by applying a resist composition for liquid immersion exposure, and is a resist film which can be used without laminating a resist protective film for liquid immersion exposure on an upper layer thereof.

* * * * *